US011536260B2

(12) United States Patent
Mou et al.

(10) Patent No.: US 11,536,260 B2
(45) Date of Patent: Dec. 27, 2022

(54) MICRO-ELECTROMECHANICAL SYSTEM PUMP

(71) Applicant: MICROJET TECHNOLOGY CO., LTD., Hsinchu (TW)

(72) Inventors: Hao-Jan Mou, Hsinchu (TW); Rong-Ho Yu, Hsinchu (TW); Cheng-Ming Chang, Hsinchu (TW); Hsien-Chung Tai, Hsinchu (TW); Wen-Hsiung Liao, Hsinchu (TW); Chi-Feng Huang, Hsinchu (TW); Yung-Lung Han, Hsinchu (TW); Chang-Yen Tsai, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 704 days.

(21) Appl. No.: 16/570,352

(22) Filed: Sep. 13, 2019

(65) Prior Publication Data

US 2020/0088185 A1 Mar. 19, 2020

(30) Foreign Application Priority Data

Sep. 17, 2018 (TW) ................................ 107132694
Sep. 20, 2018 (TW) ................................ 107133250

(51) Int. Cl.
*F04B 43/04* (2006.01)
*H01L 41/083* (2006.01)

(52) U.S. Cl.
CPC .......... *F04B 43/046* (2013.01); *H01L 41/083* (2013.01); *F05C 2253/12* (2013.01)

(58) Field of Classification Search
CPC ...... F04B 43/046; F04B 43/095; F04B 53/22; H01L 21/02104; H01L 41/081; H01L 41/083; F05C 2253/12
See application file for complete search history.

(56) References Cited

U.S. PATENT DOCUMENTS 5,115,292 A * 5/1992 Takebe ................ G01P 15/0802 257/254
5,529,465 A * 6/1996 Zengerle ............. F04B 53/1055 417/413.2

(Continued)

FOREIGN PATENT DOCUMENTS

CN 2558784 Y 7/2003
CN 102933772 A 3/2013

(Continued)

*Primary Examiner* — Matthew W Jellett
(74) *Attorney, Agent, or Firm* — Birch, Stewart, Kolasch & Birch, LLP

(57) ABSTRACT

A MEMS pump includes a first substrate, a first oxide layer, a second substrate, a second oxide layer, a third substrate and a piezoelectric element sequentially stacked to form the entire structure of the MEMS pump. The first substrate has a first thickness and at least one inlet aperture. The first oxide layer has at least one fluid inlet channel and a convergence chamber, wherein the fluid inlet channel communicates with the convergence chamber and the inlet aperture. The second substrate has a second thickness and a through hole, and the through hole is misaligned with the inlet aperture and communicates with the convergence chamber. The second oxide layer has a first chamber with a concave central portion. The third substrate has a third thickness and a plurality of gas flow channels, wherein the gas flow channels are misaligned with the through hole.

11 Claims, 5 Drawing Sheets

(56) References Cited

U.S. PATENT DOCUMENTS

| | | | | |
|---|---|---|---|---|
| 7,948,155 | B2 | 5/2011 | Hishinuma et al. | |
| 7,972,124 | B2 * | 7/2011 | Hirata | F04B 45/047 417/413.2 |
| 2004/0101990 | A1 | 5/2004 | Dunn et al. | |
| 2013/0058810 | A1 * | 3/2013 | Hirata | F04B 43/043 417/413.2 |
| 2013/0058818 | A1 * | 3/2013 | Hirata | F04B 45/047 417/479 |
| 2013/0323085 | A1 * | 12/2013 | Hirata | F04B 43/046 417/413.1 |
| 2017/0058882 | A1 * | 3/2017 | Hirata | F04B 43/04 |
| 2017/0170383 | A1 * | 6/2017 | Sammoura | B06B 1/0622 |
| 2018/0240734 | A1 | 8/2018 | Liao et al. | |
| 2022/0023683 | A1 * | 1/2022 | Mou | A61L 9/16 |

FOREIGN PATENT DOCUMENTS

| | | | |
|---|---|---|---|
| CN | 103026520 | A | 4/2013 |
| CN | 105431296 | A | 3/2016 |
| CN | 105984530 | A | 10/2016 |
| CN | 106711320 | A | 5/2017 |
| CN | 206558493 | U | 10/2017 |
| JP | 2000-154783 | A | 6/2000 |
| JP | 2014-58010 | A | 4/2014 |
| TW | M553479 | U | 12/2017 |

* cited by examiner

MICRO-ELECTROMECHANICAL SYSTEM PUMP

FIELD OF THE INVENTION

The present disclosure relates to a micro-electromechanical system (MEMS) pump, and more particularly to a MEMS pump with micron-size manufactured by a semiconductor process.

BACKGROUND OF THE INVENTION

Currently, in all fields, the products used in many sectors such as pharmaceutical industries, computer techniques, printing industries or energy industries are developed toward elaboration and miniaturization. The fluid transportation devices are important components that are used in for example micro pumps, atomizers, print heads or the industrial printers. Therefore, how to utilize an innovative structure to break through the bottleneck of the prior art has become an important part of development.

With the rapid advancement of science and technology, the application of fluid transportation device tends to be more and more diversified. For the industrial applications, the biomedical applications, the healthcare, the electronic cooling and so on, even the most popular wearable devices, the fluid transportation device is utilized therein. It is obviously that the conventional fluid transportation devices gradually tend to miniaturize the structure and maximize the flow rate thereof.

Furthermore, although the conventional miniature pumps is constantly improved its volume to be miniaturized, it still cannot broke the limitation from millimeter size to micron size. Consequently, there is a need of providing a MEMS pump with micron-size manufactured by a semiconductor process.

SUMMARY OF THE INVENTION

An object of the present disclosure provides a MEMS pump. The MEMS pump has micron-size and manufactures by a semiconductor process for reducing the limitation of the volume of the MEMS pump.

In accordance with an aspect of the present disclosure, a MEMS pump is provided. The MEMS pump includes a first substrate, a first oxide layer, a second substrate, a second oxide layer, a third substrate and a piezoelectric element. The first substrate has a first thickness and at least one inlet aperture. The first substrate is manufactured by a thinning process of a semiconductor process. The at least one inlet aperture is formed by a lithography and etching process. The first oxide layer has at least one fluid inlet channel and a convergence chamber. The first oxide layer is formed and covered upon the first substrate by the semiconductor process. The at least one fluid inlet channel and the convergence chamber are formed by the lithography and etching process, wherein one end of at least one fluid inlet channel communicates with the convergence chamber, the other end of the at least one fluid inlet channel communicates with the corresponding inlet aperture. The second substrate has a second thickness and a through hole. The second substrate is manufactured by the thinning process of the semiconductor process and placed upon the first oxide layer. The through hole is formed by the lithography and etching process, and the through hole is misaligned with the inlet apertures of the first substrate and communicates with the convergence chamber of the first oxide layer. The second oxide layer is formed upon the second substrate by a sputtering process. The second oxide layer has a first chamber with a concave central portion formed by the lithography and etching process. The third substrate has a third thickness and a plurality of gas flow channels. The third substrate is manufactured by the thinning process of the semiconductor process and placed upon the second oxide layer. The plurality of gas flow channels are formed by the lithography and etching process, and the plurality of gas flow channels are misaligned with the through hole of the second substrate. The first chamber of the second oxide layer communicates with the through hole of the second substrate and the plurality of gas flow channels of the third substrate. The piezoelectric element is formed upon the third substrate by the semiconductor process.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
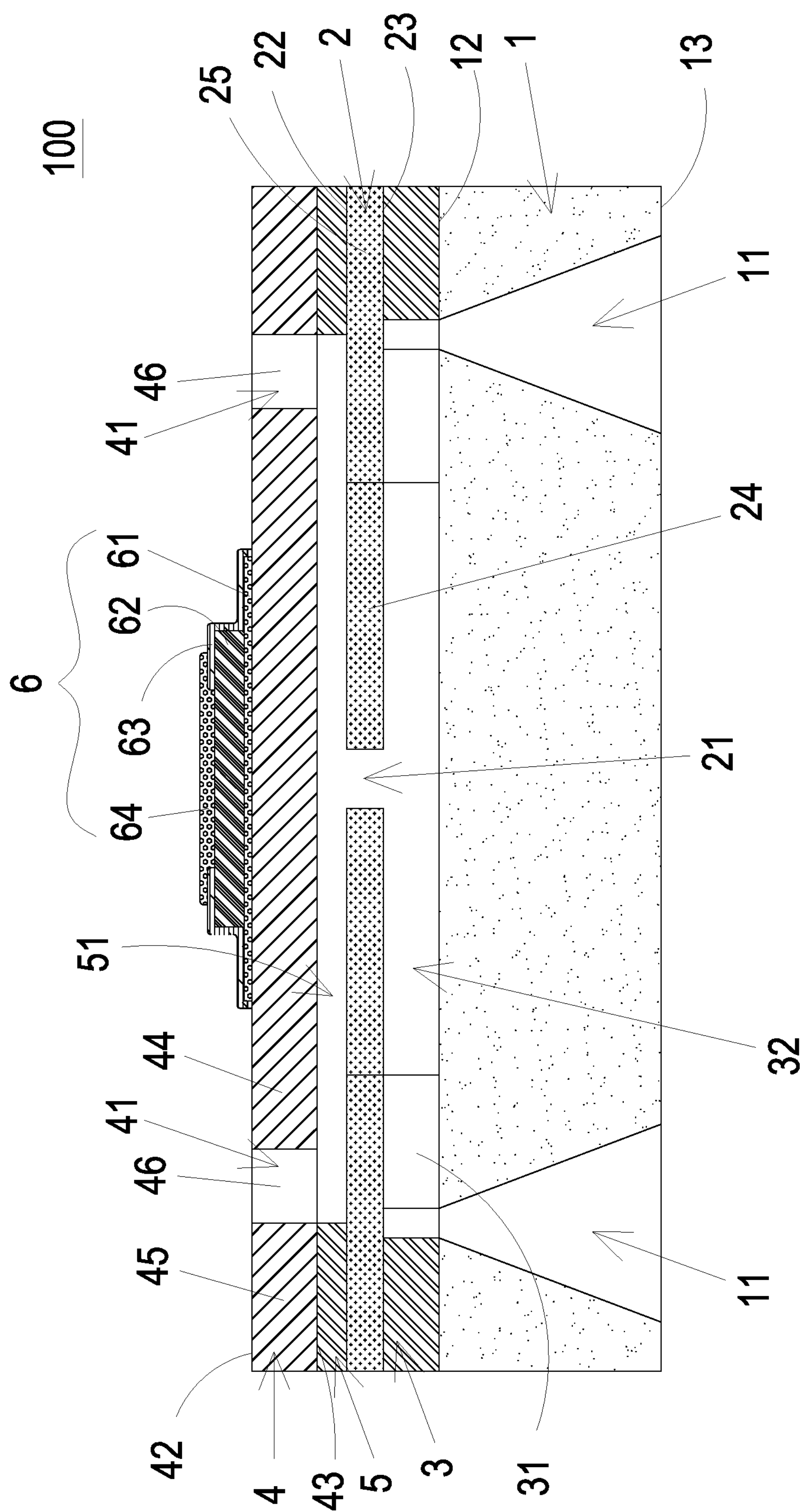
FIG. 1 is a cross-sectional view illustrating a MEMS pump according an embodiment of the present disclosure.

FIG. 1 is a cross-sectional view illustrating a MEMS pump according an embodiment of the present disclosure. The present discourse provides a MEMS pump 100 which can widely apply in many sectors such as medical biotechnology industries, energy industries, computer techniques or printing industries for guiding fluid and increasing or controlling the flow speed of fluid. Please refer to FIG. 1, the MEMS pump 100 of the present disclosure includes a first substrate 1, a second substrate 2, a first oxide layer 3, a third substrate 4, a second oxide layer 5 and a piezoelectric element 6 sequentially stacked to form the entire structure of the MEMS pump 100.

From the above, the first substrate 1, the second substrate 2 and the third substrate 4 may be made of the same material, but not limited thereto. In this embodiment, three of the above are silicon chips formed by a crystal growth process of the semiconductor process. The crystal growth process may be a polysilicon growth technique, by which the first substrate 1, the second substrate 2 and the third substrate 4 are configured as polysilicon chips. In addition, the first substrate 1 has a first thickness, the second substrate 2 has a second thickness, and the third substrate 4 has a third thickness, wherein the first thickness, the second thickness and the third thickness may be formed by a thinning process. In this embodiment, the first thickness of the first substrate 1 is larger than the third thickness of the third substrate 4, and the third thickness of the third substrate 4 is larger than the second thickness of the second substrate 2. The substrate thinning process may be grinding, etching, cutting or any other process to achieve the desired thickness of the substrate. Consequently, the first thickness is from 150 to 200 micrometers by the thinning process, the second thickness is from 2 to 5 micrometers by the thinning process, and the third thickness is from 10 to 20 micrometers by the thinning process.

The first oxide layer 3 and the second oxide layer 5 may be both made of the same material, but not limited thereto. In this embodiment, the first oxide layer 3 and the second oxide layer 5 are silicon dioxide ($SiO_2$) films, which can be formed by a sputtering process or high temperature oxidation of the semiconductor procedure, so as to form the films with desired thickness. In this embodiment, the thickness of the first oxide layer 3 is larger than the thickness of the second oxide layer 5. Consequently, the thickness of the first oxide layer 3 is from 10 to 20 micrometers, and the thickness of the second oxide layer 5 is from 0.5 to 2 micrometers.

The first substrate 1 has a first top surface 12, a first bottom surface 13 and at least one inlet aperture 11. In that, the first top surface 12 and the first bottom surface 13 both are formed by the crystal growth process of the semiconductor process, and the at least one inlet aperture 11 is formed by a lithography and etching process. Each inlet aperture 11 penetrates the first substrate 1 from the first bottom surface 13 to the first top surface 12. In this embodiment, there are two inlet holes, but the number thereof is not limited. Moreover, in order to enhance the inhale efficiency, the inlet aperture 11 is pyramid-shaped and tapered from the first bottom surface 13 to the first top surface 12.

The first oxide layer 3 described above is formed and covered upon the first top surface 12 of the first substrate 1 by the sputtering process or high temperature oxidation of the semiconductor procedure. In addition, at least one fluid inlet channel 31 and a convergence chamber 32 are formed on the first oxide layer 3 by the lithography and etching process. The number and the position of the at least one fluid inlet channel 31 corresponds to the inlet aperture 11. In this embodiment, the number of the fluid inlet channel 31 is exemplified by two, but not limited thereto. One end of each fluid inlet channel 31 communicates with the corresponding inlet aperture 11, the other end of the fluid inlet channel 31 communicates with the convergence chamber 32. Consequently, the gas inhaled from the two inlet apertures 11 can be converged into the convergence chamber 32 through the corresponding fluid inlet channels 31, respectively.

The second substrate 2 forms a second top surface 22, a second bottom surface 23, a resonance part 24 and a fixed part 25 by the crystal growth process of the semiconductor process, and a through hole 21 is formed by the lithography and etching process. The through hole 21 is located in the center of the second substrate 2, which penetrates the second top surface 22 and the second bottom surface 23. The resonance part 24 locates at the periphery region of the through hole 21, and the fixed part 25 locates at the periphery region of the resonance part 24. Moreover, the second bottom surface 23 of the second substrate 2 is disposed upon the first oxide layer 3. The through hole 21 of the second substrate 2 is perpendicularly aligned and communicates with the convergence chamber 32 of the first oxide layer 3, and the through hole 21 is misaligned with the inlet apertures 11 of the first substrate 1.

The second oxide layer 5 is formed upon the second top surface 22 of the second substrate 2 by the sputtering process or high temperature oxidation of the semiconductor process, and a central portion of the second oxide layer 5 is recessed to form a first chamber 51 by the lithography and etching process. The first chamber 51 is corresponding in position to the through hole 21 of the second substrate 2 and the resonance part 24 of the periphery region of the through hole 21. Consequently, the gas can flow into the first chamber 51 by passing the through hole 21, and the resonance part 24 can displace upward and downward in the first chamber 51.

Figure 3:
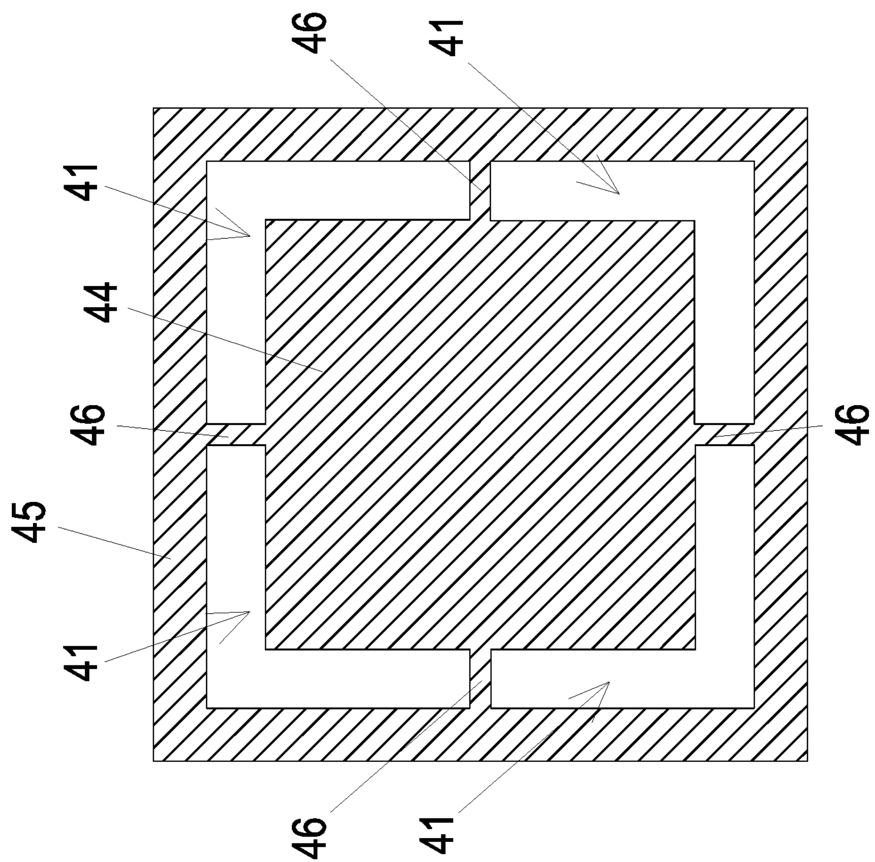
FIG. 3 is a top view illustrating a third substrate of the MEMS pump according to the embodiment of the present disclosure.

The third substrate 4 described above forms a third top surface 42 and a third bottom surface 43 by the crystal growth process of a semiconductor process. Moreover, a plurality of gas flow channels 41 penetrated the third top surface 42 and the third bottom surface 43 are formed by the lithography and etching process, and a vibration part 44, a periphery part 45 and a plurality of connection parts 46 of the third substrate 4 are also defined thereby, as shown in FIG. 3. The vibration part 44 is surrounded by the gas flow channels 41, the periphery part 45 surrounds the periphery region of the gas flow channels 41. The plurality of the connection parts 46 are disposed between the gas flow channels 41, and connect to the vibration part 44 and the periphery part 45. In this embodiment, the number of the gas flow channels 41 and the number of the connection parts 46 are four, respectively, but is not limited.

Please refer to FIG. 1 again. The piezoelectric element 6 includes a first electrode layer 61, a piezoelectric layer 62, an insulation layer 63 and a second electrode layer 64. The piezoelectric element 6 may be formed by physical vapor deposition (PVD), chemical vapor deposition (CVD) or sol-gel, but not limited thereto. In this embodiment, the first electrode layer 61 and the second electrode layer 64 are formed by film deposition such as PVD or CVD. The first electrode layer 61 is disposed on the third top surface 42 of the third substrate 4, and is placed upon the vibration part 44 of the third substrate 4. The piezoelectric layer 62 may be formed by film deposition or sol-gel, and the piezoelectric layer 62 is disposed on the first electrode layer 61. By means of that, the piezoelectric layer 62 and the first electrode layer 61 can electrically connect to each other by the contact area. Moreover, the area of the piezoelectric layer 62 is smaller than the area of the first electrode layer 61, so that the first electrode layer 61 cannot be entirely covered by the piezoelectric layer 62. Consequently, the insulation layer 63 is formed on a part of the piezoelectric layer 62 and the uncovered area of the first electrode layer 61. The insulation layer 63 only covers the two sides of the piezoelectric layer 62. At last, the second electrode layer 64 is formed on a part of the insulation layer 63 and the uncovered area of the piezoelectric layer 62. Accordingly, the second electrode layer 64 electrically connects to the piezoelectric layer 62 by the contact area, the insulation layer 63 prevents the second electrode layer 64 from directly contacting the first electrode layer 61 and thus prevents the occurrence of electrical short circuits.

Please refer to FIG. 1. The first oxide layer 3 is disposed between the first top surface 12 of the first substrate 1 and the second bottom surface 23 of the second substrate 2. The second oxide layer 5 is disposed between the second top surface 22 of the second substrate 2 and the third bottom surface 43 of the third substrate 4. Moreover, the piezoelectric element 6 is disposed on the third top surface 42 of the third substrate 4 and is corresponding in position to the first chamber 51 of the second oxide layer 5. Since the first oxide layer 3 is disposed between the first substrate 1 and the second substrate 2, the fluid inlet channels 31 communicate with the inlet apertures 11 of the first substrate 1, and the convergence chamber 32 communicates with the through hole 21 of the second substrate 2. Therefore, the gas is inhaled from the inlet apertures 11 of the first substrate 1, converged to the convergence chamber 32 by passing through the fluid inlet channels 31, and then flows upwardly through the through hole 21. Meanwhile, due to the second oxide layer 5 is disposed between the second substrate 2 and the third substrate 4, the first chamber 51 communicates with the through hole 21 of the second substrate 2 and the gas flow channels 41 of the third substrate 4. Consequently, the gas is inhaled into the first chamber 51 through the through hole 21, and then flows out upwardly from the gas flow channels 41, so as to achieve continuous gas transportation.

Figure 2A:
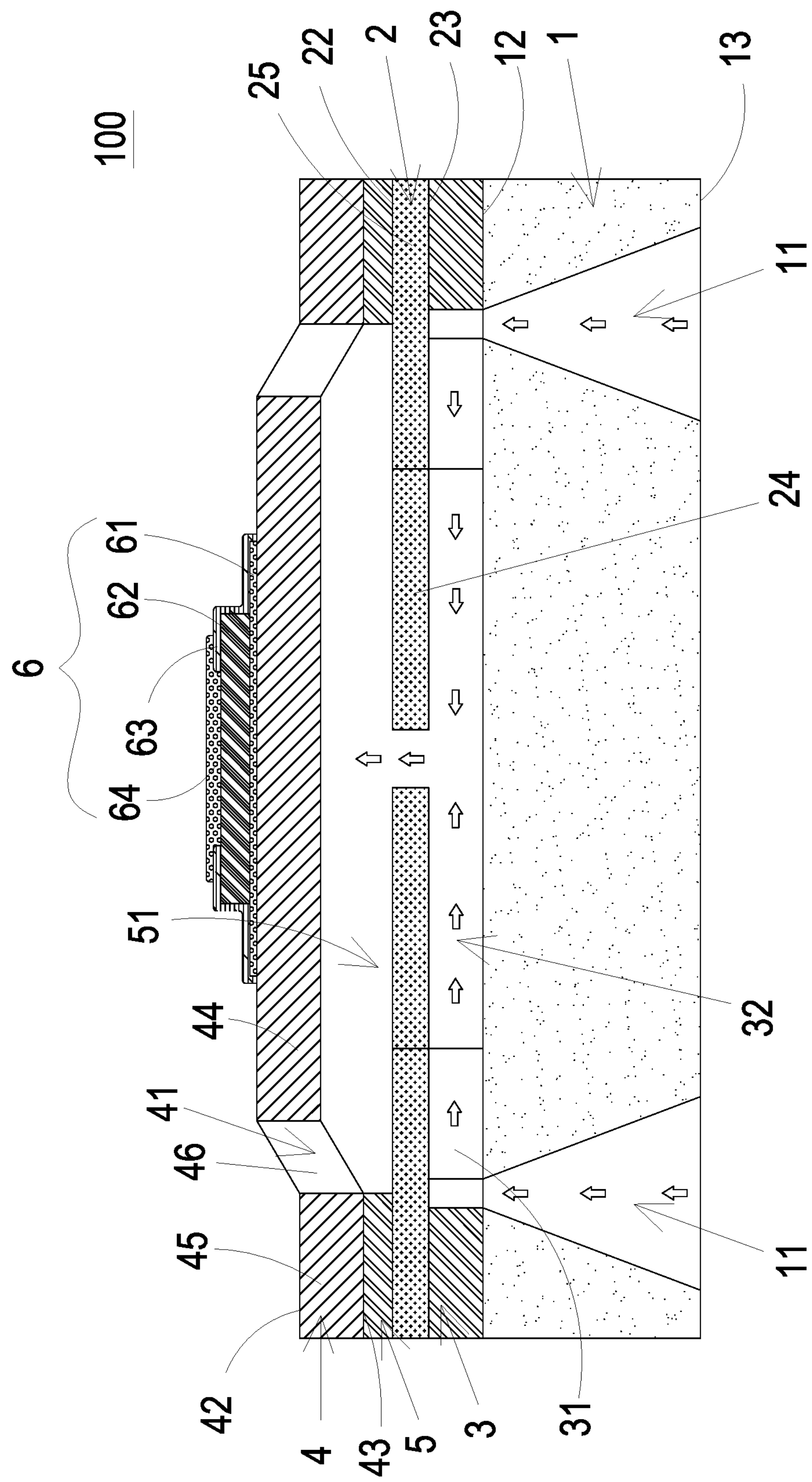
FIGS. 2A to 2C are cross-sectional views illustrating the actuations of the MEMS pump according to the embodiment of the present disclosure.
Figure 2B:
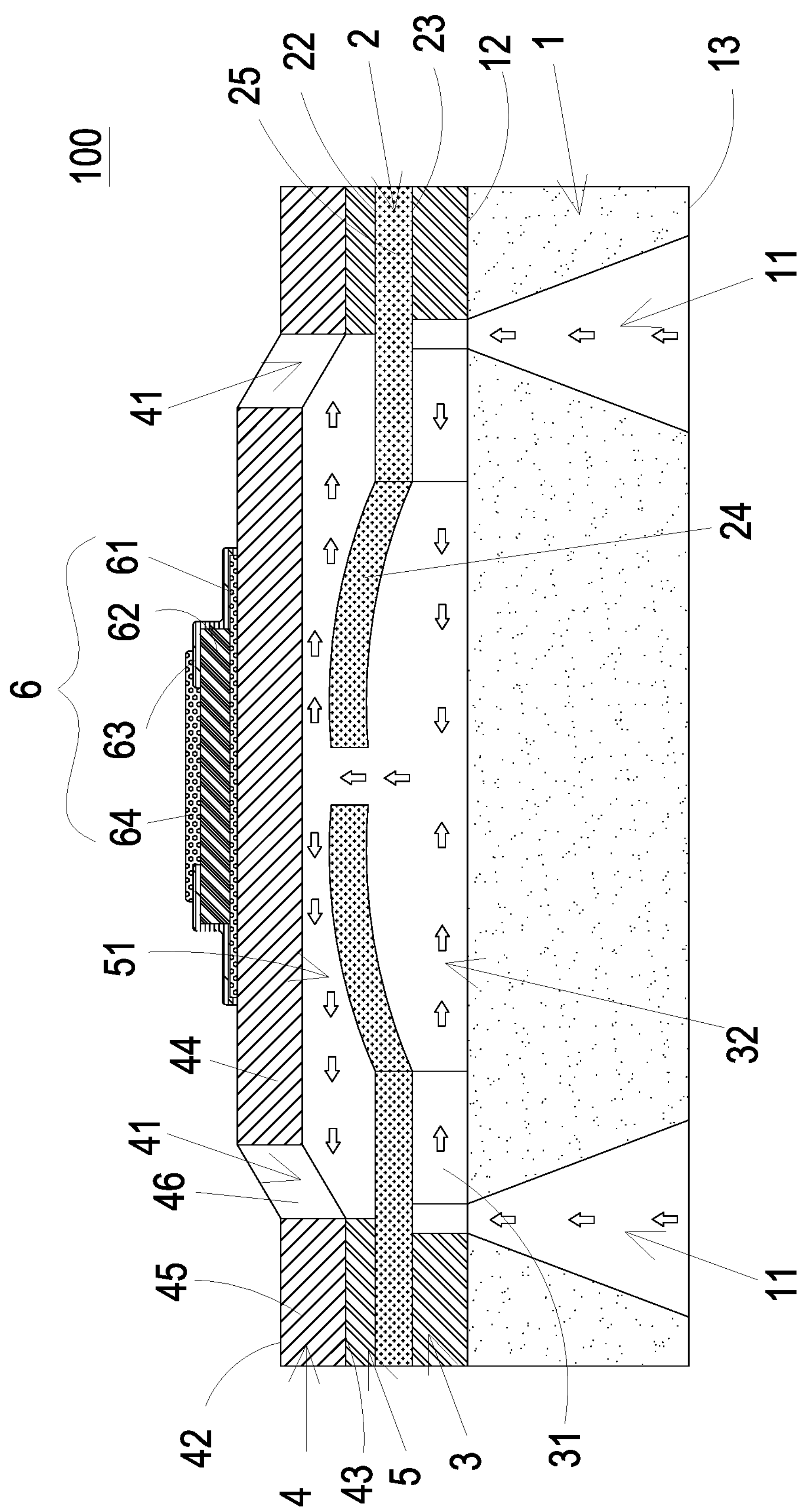
Figure 2C:
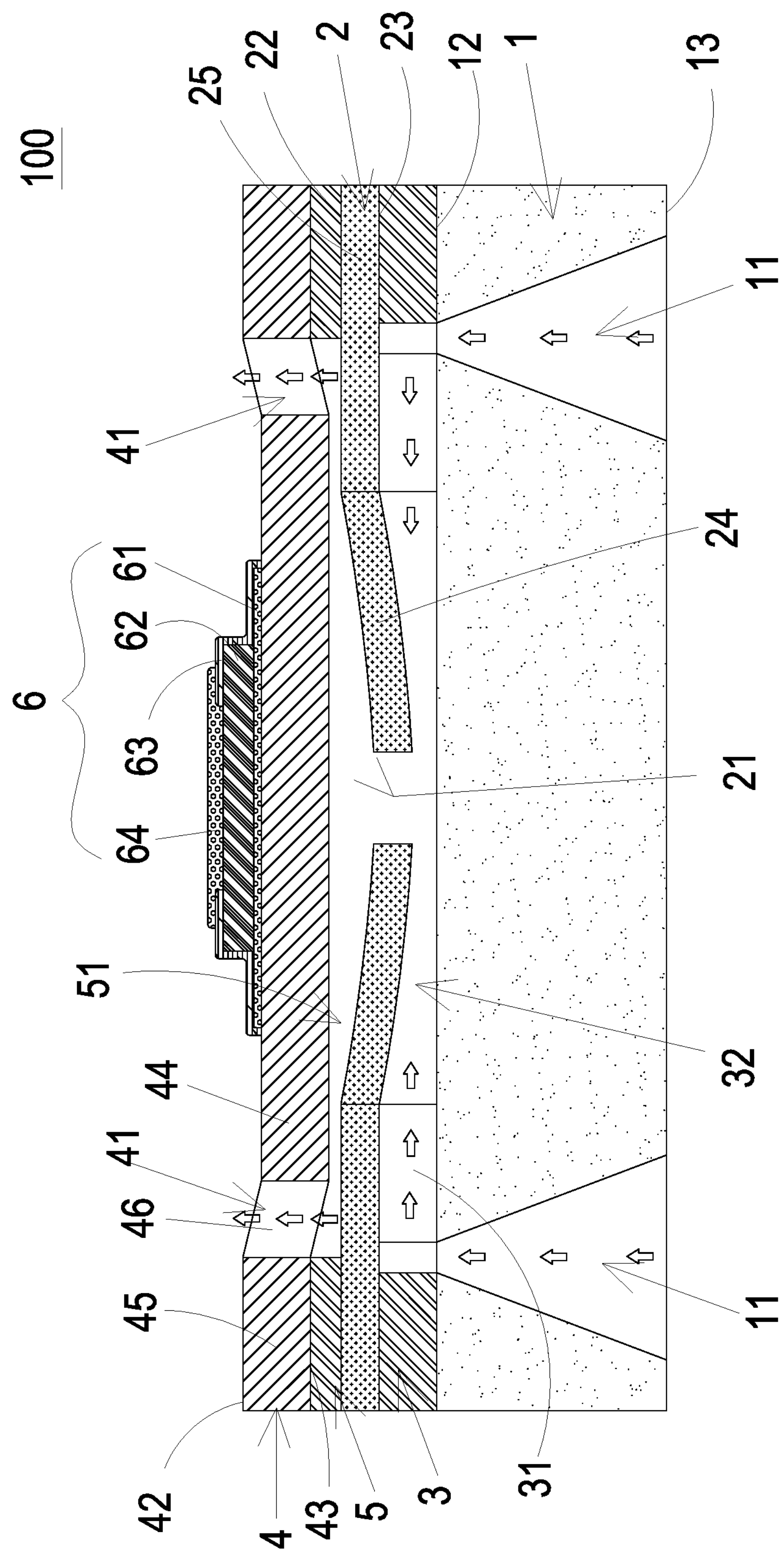

In order to understand the actuations of the MEMS pump 100 having micron-size and manufacturing by the semiconductor process, please refer to FIGS. 2A to 2C. As shown in FIG. 2A, when the first electrode layer 61 and the second electrode layer 64 of the piezoelectric element 6 receive the voltages and driving signals from the exterior, and then transmit to the piezoelectric layer 62, the piezoelectric layer 62 is subjected to deformation due to a piezoelectric effect. The variety and frequency of the deformation of the piezoelectric layer 62 are controlled by the voltages and driving signals. Owing to the deformation of the piezoelectric layer 62 described above, the vibration part 44 of the third substrate 4 is driven to displace upwardly away from the second oxide layer 5. Since the distance from the vibration part 44 to the second oxide layer 5 is increased, the volume of the first chamber 51 is expanded. In such manner, a negative pressure is generated by such expansion of the first chamber 51, so as to inhale the gas from an environment outside the MEMS pump 100 into the inlet apertures 11, and then converge the gas to the convergence chamber 32 of the first oxide layer 3.

Then, as shown in FIG. 2B. As the vibration part 44 vibrates upwardly in correspondence with the piezoelectric element 6, the resonance part 24 of the second substrate 2 resonates to vibrate upwardly, so as to compress the volume of the first chamber 51. Under this circumstance, the pressure gradient occurs to push the gas in the first chamber 51 toward the gas flow channels 41 of the third substrate 4, and the gas is then exhausted upwardly through the gas flow channels 41. Meanwhile, since the resonance part 24 vibrates upwardly to compress the first chamber 51, the volume of the convergence chamber 32 is expanded in contrast, whereby the convergence chamber 32 is also in a negative pressure state and the gas from the exterior of the MEMS pump 100 is continuously inhaled through the inlet apertures 11.

Finally, as shown in FIG. 2C, when the vibration part 44 of the third substrate 4 is driven to displace downwardly by the piezoelectric element 6, the resonance part 24 of the second substrate 2 is also driven to displace downwardly at the same time. Hence, the gas in the convergence chamber 32 is compressed and pushed to move toward the first chamber 51 through the through hole 21, and the gas from the exterior of the MEMS pump 100 temporarily stops inhaling from the inlet apertures 11. At the same time, the gas in the first chamber 51 is pushed toward the gas flow channels 41 of the third substrate 4, and exhausted outwardly. After that, the vibration part 44 is driven to displace upwardly by the piezoelectric element 6, and the volume of the first chamber 51 is increased, so that a higher suction force is generated to suck the gas into the first chamber 51 (as shown in FIG. 2A). By repeating the actuations illustrated in FIGS. 2A to 2C continuously, the vibration part 44 is driven to displace upwardly and downwardly by the piezoelectric element 6, and the resonance part 24 is actuated in resonance and is displaced, so that the inner pressure of the MEMS pump 100 is continuously changed. It achieves the transmitting and outputting operations of the MEMS pump 100.

From the above descriptions, the present disclosure provides the MEMS pump. The structure of the MEMS pump is manufactured by a semiconductor process to decrease the volume of the MEMS pump, so as to achieve the goals of light volume, miniature and reach the micron-size. Under this circumstance, the limitation of the lager volume of the MEMS pump of the prior art which cannot reach the micron-size can be solved by the present disclosure. Therefore, the MEMS pump of the present disclosure is industrially valuable.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A micro-electromechanical system (MEMS) pump, comprising:

a first substrate having a first thickness and at least one inlet aperture;

a first oxide layer having at least one fluid inlet channel and a convergence chamber, wherein the first oxide layer is formed and covered upon the first substrate one end of the at least one fluid inlet channel communicates with the convergence chamber, and the other end of the at least one fluid inlet channel communicates with the corresponding inlet aperture;

a second substrate having a second thickness and a through hole, wherein the second substrate is placed upon the first oxide layer, and the through hole is misaligned with the inlet aperture of the first substrate and communicates with the convergence chamber of the first oxide layer;

a second oxide layer formed upon the second substrate, wherein the second oxide layer has a first chamber with a central portion having a concave curve;

a third substrate having a third thickness and a plurality of gas flow channels, wherein the third substrate is placed upon the second oxide layer, the plurality of gas flow channels are misaligned with the through hole of the second substrate, and the first chamber of the second oxide layer communicates with the through hole of the second substrate and the plurality of gas flow channels of the third substrate; and a piezoelectric element formed upon the third substrate and comprising:

a first electrode layer;

a piezoelectric layer disposed on the first electrode layer;

an insulation layer covered on a part of the piezoelectric layer and a part of the first electrode layer; and a second electrode layer disposed on a part of the insulation layer and a uncovered area of the piezoelectric layer for electrically coupling with the piezoelectric layer, wherein the uncovered area of the piezoelectric layer is not in contact with the insulation layer.

2. The MEMS pump according to claim 1, wherein the first substrate, the second substrate and the third substrate are silicon chips.

3. The MEMS pump according to claim 2, wherein the silicon chips are polysilicon chips.

4. The MEMS pump according to claim 1, wherein the inlet hole of the first substrate is pyramid-shaped.

5. The MEMS pump according to claim 1, wherein the first thickness is from 150 to 200 micrometers.

6. The MEMS pump according to claim 1, wherein the second thickness is from 2 to 5 micrometers.

7. The MEMS pump according to claim 1, wherein the third thickness is from 10 to 20 micrometers.

8. The MEMS pump according to claim 1, wherein the first thickness is larger than the third thickness, and the third thickness is larger than the second thickness.

9. The MEMS pump according to claim 1, wherein the thickness of the first oxide layer is from 10 to 20 micrometers.

10. The MEMS pump according to claim 1, wherein the thickness of the second oxide layer is from 0.5 to 2 micrometers.

11. The MEMS pump according to claim 1, wherein the thickness of the first oxide layer is larger than the thickness of the second oxide layer.

* * * * *